United States Patent [19]

Frijlink

[11] Patent Number: 4,748,135

[45] Date of Patent: May 31, 1988

[54] METHOD OF MANUFACTURING A SEMICONDUCTOR DEVICE BY VAPOR PHASE DEPOSITION USING MULTIPLE INLET FLOW CONTROL

[75] Inventor: Peter M. Frijlink, Crosne, France

[73] Assignee: U.S. Philips Corp., New York, N.Y.

[21] Appl. No.: 54,543

[22] Filed: May 27, 1987

[30] Foreign Application Priority Data

May 27, 1986 [FR] France ................... 8607538

[51] Int. Cl.$^4$ .................. H01L 7/34; H01L 21/20
[52] U.S. Cl. ...................... 437/102; 137/81; 137/225; 137/605; 148/DIG. 57; 148/DIG. 110; 156/611; 156/612
[58] Field of Search ............... 137/889, 890, 896, 605; 118/715; 156/610–614; 437/102, 103, 104, 81, 225; 148/DIG. 57, 110; 427/255.1

[56] References Cited

U.S. PATENT DOCUMENTS

| | | | |
|---|---|---|---|
| 3,121,062 | 2/1964 | Gould | 156/611 |
| 3,394,390 | 7/1968 | Cheney | 156/611 |
| 3,619,282 | 11/1971 | Manley et al. | 156/611 |
| 3,637,434 | 1/1972 | Nakanuma et al. | 156/611 |
| 3,701,682 | 10/1972 | Gartman et al. | 156/611 |
| 3,901,746 | 8/1975 | Boucher | 437/102 |
| 3,930,908 | 1/1976 | Jolly | 437/102 |
| 4,007,074 | 2/1977 | Ogirima et al. | 156/613 |
| 4,094,268 | 6/1978 | Schieber et al. | 156/610 |
| 4,190,470 | 2/1980 | Walline | 156/611 |
| 4,299,649 | 11/1981 | Gentile et al. | 156/610 |
| 4,488,914 | 12/1984 | Quinlan et al. | 156/614 |
| 4,689,094 | 8/1987 | Van Rees et al. | 437/104 |

FOREIGN PATENT DOCUMENTS

| | | | |
|---|---|---|---|
| 0011576 | 2/1978 | Japan | 156/611 |
| 0097045 | 5/1985 | Japan | 148/DIG. 57 |
| 0132321 | 7/1985 | Japan | 148/DIG. 57 |
| 0182723 | 9/1985 | Japan | 148/DIG. 57 |
| 0182722 | 9/1985 | Japan | 148/DIG. 57 |
| 0235794 | 10/1985 | Japan | 148/DIG. 57 |

Primary Examiner—Brian E. Hearn
Assistant Examiner—William Bunch
Attorney, Agent, or Firm—Norman N. Spain

[57] ABSTRACT

A method of manufacturing a semiconductor device including the step of depositing from the vapor layers on a substrate in the chamber of a reactor in which a vector gas and a reactant gas are introduced, characterized in that the vector gas and the reactant gas are introduced into the chamber of the reactor by means of a system of three coaxial tubes, the first of which (the inner tube) has a diameter smaller than that of the second tube (the intermediate tube), which in turn has a diameter smaller than that of the third tube (the outer tube), the first ends of these tube being independent, but the second ends thereof situated in the proximity of each other cooperating with each other so as to form a valve controlling the introduction of the reactant gas into the hot zone of the chamber of the reactor mixed with a vector gas, these tubes being disposed in such a manner that: the said second end of the inner tube merges into the intermediate tube, the said second end of the intermediate tube provided with a restriction merges into the outer tube, the said second end of the outer tube provided with a restriction merges into the chamber of the reactor in the proximity of the hot zone, the said first end of the intermediate tube is provided with a valve V, in that the reactant gas is introduced through the first end of the inner tube and circulates in the direction of the second end to the intermediate tube, in that the vector fluid is introduced through the first end of the outer tube and circulates in the direction of the second end to the chamber of the reactor, in that, the flow rate of the vector gas being chosen to be very much higher than the flow rate of the reactant gas, the tube system behaves like a commutation valve which directs the whole quantity of reactant gas to the chamber of the reactor when the valve V is closed and to the first end of the intermediate tube when the valve V is opened.

3 Claims, 1 Drawing Sheet

METHOD OF MANUFACTURING A SEMICONDUCTOR DEVICE BY VAPOR PHASE DEPOSITION USING MULTIPLE INLET FLOW CONTROL

BACKGROUND OF THE INVENTION

The invention relates to a method of manufacturing a semiconductor device including the step of depositing from the vapour phase layers on a substrate in the chamber of a reactor in which a vector gas and a reactant gas are introduced.

The term "reactant gas" is to be understood to mean any gas necessary for carrying out an operation or a reaction.

The term "reactor" is to be understood to mean any place or any space in which the operation or the reaction is effected.

The term "vector gas" is to be understood to mean any gas compatible with the reaction or the operation, but not necessarily participating in this operation or reaction. This may be, for example, a completely neutral gas with respect to the reaction or constituting the atmosphere or the medium favourable for a good procedure of the reaction.

The invention is used in the manufacture of active semiconductor devices including epitaxial layers or implanted layers of, for example, materials from the group III-V.

It is known from U.S. Pat. No. 3,930,908 to introduce into the chamber of a reactor for epitaxy from the vapour phase by means of valves of conventional structures gaseous reactant compounds mixed with a vector gas. The regulation, the interruption or the commutation of the flow of these gases then take place, dependent upon the circumstances, by opening or closing cocks or valves causing mechanical elements to be displaced with respect to each other.

However, the use of these conventional cocks or valves proves to be difficult and even impossible in numerous cases and more particularly:

when the gases used are corrosive;

when these gases are polluting and a decontamination is necessary to realize the subsequent commutation with another gas, this decontamination is made difficult due to the fact that the materials constituting the valves are most frequently attacked by the products used for the decontamination;

when these gases have to be kept at a high temperature during their flow, which may be the case with gaseous compounds which are crystallized at the ambient temperature or are solidified: in fact at the high temperature for epitaxy from the vapour phase, such as the temperature lying between 600° and 900° C., the materials satisfying the purity conditions imposed by the epitaxy from the vapour phase are not materials permitting of manufacturing in a simple manner valves satisfying the tightness conditions. Thus, with epitaxy from the vapour phase, metals are excluded because they can contaminate or be attacked by the reactant gas;

when these gases have to be used at very low flow rates or in very small quantities: in fact, the variations of the parasitic pressure due to the commutation can produce errors in the thickness of the epitaxial layers or errors in the doping of the layers formed, which results in that thicknesses of very thin layers, abrupt variations in composition or abrupt variations in doping cannot be obtained by means of the valves of conventional structures.

when these gases have the property that they are adsorbed or desorbed by the materials constituting the tubes transporting them. Thus, the phenomenon of adsorption or desorption of the walls of the tubes after the point of commutation often gives rise to unacceptable memory effects if these tubes are long or cold and especially if these gases to be commuted have molecules having a large bipolar moment. These memory effects can also lead to errors in the thickness of the layers or the doping.

For all these reasons, the conventional valves have to be avoided.

Therefore, the present invention provides a method of manufacturing, in which these disadvantages are avoided.

SUMMARY OF THE INVENTION

According to the present invention, this object is achieved by means of a method of the kind defined in the opening paragraph, characterized in that the vector gas and the reactant gas are introduced into the chamber of a reactor by means of a system of three coaxial tubes, the first of which (the inner tube) has a diameter smaller than that of the second tube (the intermediate tube), which in turn has a smaller diameter than that of the third tube (the outer tube), the first ends of these tubes being independent, but the second ends of these tubes situated in the proximity of each other cooperating with each other so as to form a valve which controls the introduction of the reactant gas into the hot zone of the chamber of the reactor mixed with the vector gas, these tubes being disposed in such a manner that:

the said second end of the inner tube merges into the intermediate tube, the said second end of the intermediate tube provided with a restriction merges into the outer tube, the said second end of the outer tube provided with a restriction merges into the chamber of the reactor in the proximity of the hot zone, the said first end of the intermediate tube is provided with a valve V, in that the reactant gas is introduced through the first end of the inner tube and circulates in the direction of the second end to the intermediate tube, in that the vector gas is introduced into the first end of the outer tube and circulates in the direction of the second end to the chamber of the reactor, in that, the flow rate of the vector gas being chosen to the much higher than the flow rate of the reactant gas, the tube system behaves like a commutation valve, which directs the whole quantity of reactant gas to the chamber of the reactor when the valve V is closed, and in that the tube system behaves like a commutation valve, which directs the whole quantity of reactant gas to the first end of the intermediate tube when the valve V is opened.

According to the invention, this method can further be characterized in that one or several other reactant gases are introduced into the chamber of the reactor through one or several other such systems of three tubes.

The method according to the invention has inter alia the following advantages:

Since the tube system constituting in itself the valve for introducing the reactant gases into the chamber can be made of a material, such as quartz, which satisfies the purity conditions, epitaxial layers of very high quality can be obatined; moreover, when the tube system is made of such a material, the decontamination, if any, can readily be obtained by means of, for example, a chlorinated gas, which ensures that the method of manufacturing the epitaxial layers is simplified and guarantees that the quality of the layers is maintained in the long run;

the tube system permitting a rapid commutation without any dead space in which the gas remains stagnant and trails of gaseous compounds are produced after commutation, for example, due to the desorption of the walls, thicknesses of very thin layers, abrupt variations in composition or abrupt variations in doping can be obtained;

in general, by means of the method according to the invention, the epitaxial layers or implanted layers are obatined in a simpler manner and are of higher quality.

BRIEF DESCRIPTION OF THE DRAWINGS

In order that the invention may be readily carried out, it will now be described more fully, by way of example, with reference to the accompanying drawings, in which.

DETAILED DESCRIPTION OF THE PREFERRED EMBODIMENTS

Figure 1:
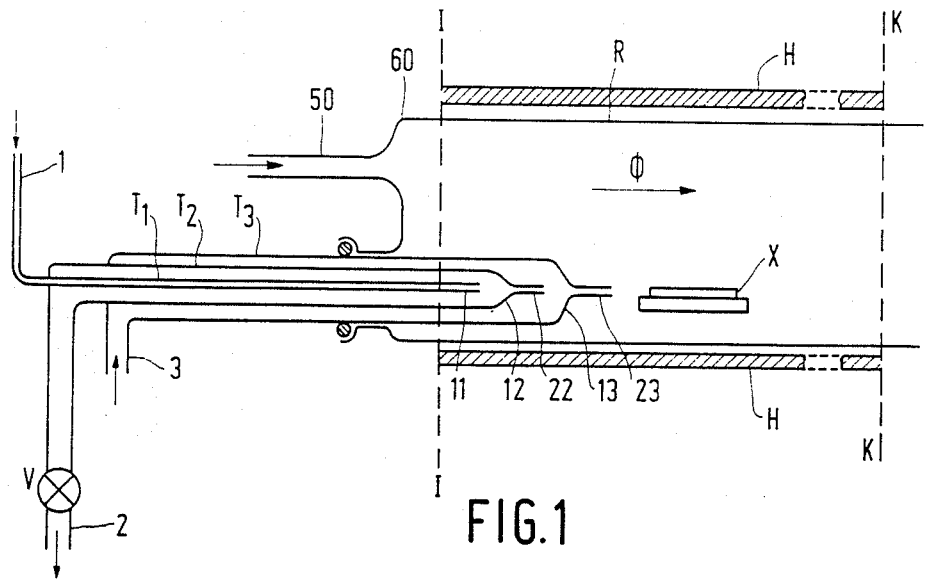
FIG. 1 shows diagrammatically a reactor for forming layers obtained by epitaxy from the gaseous phase, this reactor being provided with an arrangement according to the invention.

As shown in FIG. 1, the arrangement used in the method of manufacturing a semiconductor device according to the invention comprises a system of three coaxial tubes $T_1$, $T_2$, $T_3$.

The first tube $T_1$ (the inner tube) has a diameter smaller than that of the second tube $T_2$ (the intermediate tube). This second tube $T_2$ has in turn a diameter smaller than that of the third tube $T_3$ (the outer tube).

The ends 1, 2 and 3 ( the first ends of the three tubes $T_1$, $T_2$, $T_3$) are independent. The three tubes $T_1$, $T_2$, $T_3$ become integral and coaxial only in the proximity of their second ends 11, 12, 13.

The second end 11 of the inner tube $T_1$ merges into the intermediate tube $T_2$ in the proximity of the second end 12 of the latter.

The second end 12 of the intermediate tube $T_2$ is provided with a restriction 22 and merges into the outer tube $T_3$ in the proximity of the second end 13 of the latter.

The second end 13 of the outer tube $T_3$ is provided with a restriction 23 and merges into the chamber of the reactor R.

The first end 2 of the intermediate tube $T_2$ is provided with a valve V.

The chamber of the reactor R comprises a space in which a monocrystalline semiconductor sample X is placed on a sample carrier. The sample carrier is arranged in the proximity of a source of heat H situated outside the chamber so that the sample is situated in a hot zone whose temperature is that required for the epitaxial growth from the vapour phase.

The compounds necessary for the epitaxial growth of a layer or reactants are introduced in gaseous form and form a flux $\Phi$ which circulates from one end 60 of the chamber in the direction of an outlet to the other end of the chamber and which passes into the hot zone of the chamber in the direction indicated by the arrow in FIG. 1.

The reactant gases may be either products entering the composition of the epitaxial layer itself or products intended for doping of said layer. These reactant gases are mixed with a gas which is neutral for the reactor (the so-called vector gas) and their partial pressure with respect to this neutral gas has to be determined with a high accuracy.

As has been stated above, certain of these reactant gases have the disadvantage of being strongly adsorbed by the cold walls. These gases must then necessarily be introduced into the hot zone of the reactor bounded by the planes whose countour is II and KK in FIG. 1.

According to the invention, the reactant gas is introduced through the end 1 of the inner tube $T_1$ and circulates in the direction of the second end 11 to the intermediate tube $T_2$.

The vector gas is introduced through the end 3 of the outer tube $T_3$ and circulates in the direction of its second end 13 to the chamber of the reactor R.

Figure 2:
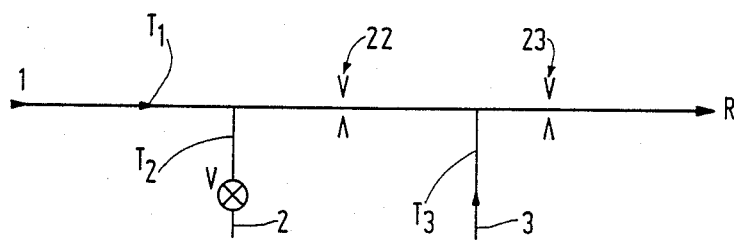
FIG. 2 shows diagrammatically the arrangement according to the invention.

As shown in FIG. 2, which represents the equivalent circuit diagram of the system, when the valve V is closed, the system behaves like a commutation valve which directs the whole quantity of reactant gas to the chamber R.

When on the contrary the valve V is opened, the system behaves like a commutation valve which directs the whole quantity of reactant gas to the first end 2 of the intermediate tube $T_2$, the flow rate of the vector gas being much higher than the flow rate of the reactant gas (of the order of 5 to 10 times higher).

The system according to the invention consequently provides the advantage mentioned above and more particularly the advantage that it takes along the reactant gases to the intermediate proximity of the hot zone, as shown in FIG. 1, which permits of avoiding the adsorption and desorption phenomena after commutation and hence of avoiding the disadvantage of the memory effect.

On the other hand, there can be provided in the chamber of the reactor R in the proximity of the area 23 at which the tube $T_3$ merges an inlet 50 for gaseous compounds less sensitive to the cold walls circulating to the outlet of the chamber R in the same direction as the reactant gas and the first vector gas.

These compounds can be supplied by a device of the kind described in the French Patent Application filed under number 8507204. This Application discloses a device which permits of very accurately controlling the partial pressures of each of the reactant gases leading to the realization of epitaxial layers from the gaseous phase whose composition and thickness are very precise.

Finally, there can be provided in the chamber of the reactor at the end 60 of the latter one or several other devices according to the present invention for different reactant gases.

An example of a reactant gas which is strongly adsorbed by the cold walls and at the same time is frequently used in the manufacture of the semiconductor devices for doping of the layers especially of gallium arsenide (GaAs) is selenium hydride ($H_2Se$). It will be clear that the tube system according to the invention is particularly favourable for the formation of epitaxial layers doped with selenium (Se).

A very favourable material for realization of the tube system according to the invention is quartz because this material is particularly easy to decontaminate in the application for the manufacture of semiconductor devices, for example of the group III-V. Moreover, quartz satisfies all the purity conditions suitable for formation of epitaxial layers of high quality.

It should be noted that the operation of the tube system according to the invention does not depend upon the high quality of the valve V (cf. FIG. 1). In fact, this valve may, for example, leak slightly without the operation of the system being adversely affected thereby. This guarantees a long life for the system according to the invention.

What is claimed is:

1. A method of manufacturing a semiconductor device including the step of depositing from the vapour phase layers on a substrate in a chamber of a reactor in which a vector gas and a reactant gas are introduced, said chamber being provided with a hot zone, characterized in that the vector gas and the reactant gas are introduced into the chamber of the reactor by means of a system of three coaxial tubes, the first of which (the inner tube) has a diameter smaller than that of the second tube (the intermediate tube), which in turn has a diameter smaller than that of the third tube (the outer tube), each of said tubes having a first end and a second end the first ends of said tubes being independent, but the second ends thereof being situated in the proximity of each other and cooperating with each other so as to form a valve controlling the introduction of a mixture of the reactant gas and the vector gas into the hot zone of the chamber of the reactor, these tubes being disposed in such a manner that:

the said second end of the inner tube merges into the intermediate tube, the said second end of the intermediate tube, which is provided with a restriction, merges into the outer tube, the said second end of the outer tube, which is provided with a restriction, merges into the chamber of the reactor in the proximity of the hot zone, the said first end of the intermediate tube is provided with a valve V, in that the reactant gas is introduced through the first end of the inner tube and circulates in the direction of the second end of the intermediate tube, in that the vector gas is introduced through the first end of the outer tube and circulates in the direction of the second end of the chamber of the reactor, in that the flow rate of the vector gas is much higher than the flow rate of the reaction gas, in that, the flow rate of the vector gas being chosen to be much higher than the flow rate of the reactant gas, the tube system behaves like a commutation valve, which directs the whole quantity of reactant gas to the chamber of the reactor when the valve V is closed, and which directs the whole quantity of reactant gas to the first end of the intermediate tube when the valve V is opened.

2. A method as claimed in claim 1, characterized in that one or several other reactant gases and vector gases are introduced through one or several other respective systems of three coaxial tubes into the chamber of the reactor.

3. A method as claimed in claim 1 characterized in that the system(s) of three coaxial tubes is (are) made of quartz.

* * * * *